United States Patent [19]

Newkirk et al.

[11] 4,343,836

[45] Aug. 10, 1982

[54] ONE-DIRECTIONAL UNIFORMLY COATED FIBERS, METHOD OF PREPARATION, AND USES THEREFOR

[75] Inventors: Lawrence R. Newkirk, Los Alamos; Flavio Valencia, Santa Fe; Robert E. Riley; Terry C. Wallace, Sr., both of Los Alamos, all of N. Mex.

[73] Assignee: United States of America as represented by the United States Department of Energy, Washington, D.C.

[21] Appl. No.: 61,152

[22] Filed: Jul. 26, 1979

[51] Int. Cl.$^3$ .................................... C23C 11/08
[52] U.S. Cl. ............................ 427/249; 264/29.2; 264/29.6; 427/251; 427/255; 427/294; 427/295; 427/299; 427/319; 427/377; 427/383.3; 427/383.5; 427/383.7; 427/383.9; 427/370
[58] Field of Search ............... 427/253, 251, 319, 294, 427/299, 295, 370, 377, 383, 383 A, 383 B, 383 C, 383 D, 255, 249, 383.3, 383.5, 383.7, 383.9; 264/29.6, 29.2; 428/902, 539, 367, 368, 374, 375, 388, 381, 378, 389, 251, 245, 246

[56] References Cited

U.S. PATENT DOCUMENTS

| | | | |
|---|---|---|---|
| 2,885,310 | 5/1959 | Olson et al. | 427/253 |
| 3,189,563 | 6/1965 | Havel | 428/388 |
| 3,269,802 | 8/1966 | Wainer et al. | 23/349 |
| 3,294,880 | 12/1966 | Turkal | 264/29 |
| 3,369,920 | 2/1968 | Boudeau et al. | 427/253 |
| 3,617,359 | 11/1971 | Wakefield | 427/253 |
| 3,625,755 | 12/1971 | Petrafke | 428/388 |
| 3,991,248 | 11/1976 | Bauer | 428/245 |
| 4,138,512 | 2/1979 | Glaski | 427/253 |
| 4,180,428 | 12/1979 | Riley et al. | 427/249 |

OTHER PUBLICATIONS

Aggour et al., "Chemical Vapor Deposition of Pyrocarbon, SiC, TiC, TiN, Si and Ta on Different Types of Carbon", Carbon, 1974, vol. 12, pp. 358–362.
Fitzer et al., Processing Studies of the Chemical Vapor Deposition of Niobium and Tantalum", Chemical Vapor Deposition, 4th Int. Conf., 1973, pp. 144–146.
Fitzer et al., "Gasphasenabscheidung von Siliziumkarbid, Pyrokohlenstoff und Tantal auf Kohlenstoffasern", Vortrag auf der Interationalen Kohlenstofftagung Carbon '72, Baden–Baden, 1972, 174–175.
Powell et al., The Formation of Metallic Coatings by Vapor–Phase Techniques, Metal Finishing, vol. 50, No. 4, Apr. 1952.

Primary Examiner—Norman Morgenstern
Assistant Examiner—Janyce A. Bell
Attorney, Agent, or Firm—Elizabeth O. Slade; Paul D. Gaetjens; James E. Denny

[57] ABSTRACT

A problem addressed by this invention was how to obtain very long lengths of refractory metal-coated multifilamentary yarns having a uniform coating on the filaments which make up each yarn, the coating being uniform throughout the length of the yarn such that the coated yarns are suitable for being woven and are suitable for a variety of other uses. The solution is a continuous process which employs a chemical vapor deposition reaction at relatively low temperature and pressure and a separation of the gaseous reaction products from the coated yarn prior to allowing the coated yarn to cool.

12 Claims, 3 Drawing Figures

ONE-DIRECTIONAL UNIFORMLY COATED FIBERS, METHOD OF PREPARATION, AND USES THEREFOR

BACKGROUND OF THE INVENTION

1. Field of the Invention

This invention relates to a method of producing fiber reinforced matrix composites, to methods of using such composites, and to articles prepared from such composites. It is a result of a contract with the Department of Energy Contract No. W-7405-Eng:36.

Modern carbon and graphite yarns exhibit extremely high tensile strengths and Young's modulus values on the order of about 500 GPa. Thus, a great deal of interest in the use of such fibers has resulted. One particular area of interest is in high temperature applications of such fibers after they have been coated with ceramic materials (i.e., materials made by the baking or firing of nonmetallic material). In the formation of fiber reinforced ceramic matrix composites, the ceramic phase must infiltrate into the assemblage which is made up of the yarns. In two-, three-, and even one-dimensional composites, such infiltration is difficult because the assemblages are made up of a very large number of filaments with small spacings (at most, several microns) between the filaments. However, in order to obtain optimal mechanical properties using carbon of graphite fibers, it is essential that each filament (i.e., fiber) making up a strand of yarn be uniformly coated either with the ceramic phase or with a metal which can be reacted with the carbon or graphite fiber to form the ceramic phase, but leaving an inner core of carbon or graphite after such a ceramic-forming reaction. Also needed is a method of economically producing very long lengths of coated carbon and graphite yarn. It is also essential that gaps or voids not be present at the interface of the ceramic and inner core in a coated fiber which is to be subjected to stresses at high temperatures, since such gaps will result in degradation of the coated fiber. Since it is known that such gaps do form when a metal coated carbon or graphite fiber is heated to a temperature sufficiently high to form a metal carbide, a method which eliminates such gaps is needed.

2. Prior Art

In the prior art, although U.S. Pat. No. 3,269,802, Wainer et al., discloses a process wherein hydrogen reacts with a metal halide at the surface of a carbonized material, that patent does not disclose a method for forming a weavable fiber but instead forms a carbide which is brittle. Additionally, that patent does not even address the problem of obtaining a uniform metal deposition throughout the bundle of tiny filaments which make up the larger yarn strand. Neither does Wainer address the problem of canning (i.e., coating only the outer and not the inner filaments of the yarn bundle), which phenomenon occurs when the pressure in the coating chamber is not below about 300 torr. Neither does Wainer teach or suggest hot pressing of a coated product.

U.S. Pat. No. 3,369,920, Bourdeau, discloses a process for uniformly depositing a coating onto various materials; however, that coating is a pyrolytic coating and requires a deposition temperature from 1300 to 2100 degrees centigrade, a temperature range which is far above the range employed in the present invention. At such temperatures, the fiber material to be coated would be damaged, and canning would occur. Furthermore, Bourdeau does not form a weavable product, but instead forms a brittle product. Additionally, Bourdeau does not teach or suggest hot pressing of a coated product.

U.S. Pat. No. 3,294,880, Turkat, discloses a process for preparing unifilamentary pyrographite, metal carbide, or ceramic filaments; however, the problem of uniformly coating the individual fibers in a multifilamentary yarn strand as described in the present invention is not mentioned or alluded to. The only temperatures recited in that patent are in the range of 1900°–2300° C.; and if a vapor deposition reaction were carried out in that range, canning would definitely occur. Furthermore, Turkat does not teach or suggest hot pressing of a coated product.

U.S. Pat. No. 3,991,248, Bauer, describes a process for forming fiber-reinforced composite articles by depositing pyrolytic materials onto the fibers. Here again, however, there is no teaching of how to avoid the problem of canning nor any recognition that it may be a problem. In that patent, there is no suggestion of the desirability of obtaining uniform coating of the tiny individual filaments making up each strand; instead, a uniform coating around the outside of the large strand is desired so that bonding between the strands will occur. Thus, for the purposes in Bauer, canning may indeed not be a problem. Also, in order to deposit refractory metals as pyrolytic materials, much higher temperatures would be required for the pyrolysis reaction than are used in the present invention; and at those higher temperatures, canning will occur. Additionally, in that patent, there is no teaching nor suggestion of the desirability of hot pressing in order to densify the product. Instead, Bauer performs densifying by a second infiltration of pyrolytic material. A fiber reinforced metal-coated product produced in Bauer would not be very useful at high temperatures (greater than 1300 degrees centigrade) because carbides would form at such temperatures by a diffusion reaction of the metal with the carbon substrate and thus gaps or voids would form, leading to a weakened product.

Thus, although there are methods of coating carbon and graphite fibers in the prior art, these methods have not even addressed, much less solved, the problem of coating very long lengths of a unidirectional yarn fiber bundle so that the individual filaments (including both the inner and outer filaments) making up the fiber bundle are all substantially uniformly coated throughout the bundle and so that the coating of the individual filaments at any one cross section is substantially the same as the coating at any other cross section. Furthermore, the prior art has not taught a process for obtaining such a uniform coating of fibers using refractory metals so that the coated filament is not brittle and can be woven. Furthermore, the prior art has not solved the problem of eliminating voids or gaps in unidirectional ceramic matrix composite fibers.

Objects of the Invention

An object of this invention was to produce very long lengths of metal coated carbon, metal, ceramic, and graphite yarns having a uniform microstructure throughout, having good flexibility and strength, and being useful for a wide variety of purposes.

A further object of the invention was to produce two- and three-dimensional fiber reinforced ceramic matrix composites formed from carbon and graphite fiber yarns which have a ceramic coating, which have a uniform microstructure throughout, and which exhibit great strength and good heat resistant properties.

Other objects, advantages and novel features of the invention will become apparent to those skilled in the art upon examination of the following detailed description of preferred embodiments of the invention and the accompanying drawings.

SUMMARY OF THE INVENTION

According to the invention, long lengths of multifilamentary carbon, graphite, ceramic or metallic yarn are coated in a continuous process with at least one refractory metal selected from the group consisting of tantalum (Ta), niobium (Nb), molybdenum (Mo), tungsten (W), and rhenium (Re) such that the individual tiny filaments making up each yarn are individually, rapidly, and substantially uniformly coated by the following method comprising: (1) reacting a volatile halide of the coating metal with hydrogen in the presence of the yarn which is being pulled continously through a coating chamber at a temperature sufficiently high for the reaction to proceed but lower than about 1100° C. and at reduced pressure less than about 300 torr and (2) separating the coated yarn from the gaseous reactants and gaseous reaction products before the coated yarn is allowed to cool. Also according to the invention, in one embodiment, the resulting flexible metal-coated fibers are hot-pressed into fiber-reinforced ceramic matrix composites in the form of billets which, when the coating metal was tantalum and when the yarn was graphite, exhibited about twice the flexure strength of billets prepared from hot pressed powders of composites of tantalum carbide (TaC) and graphite having the same weight composition of materials. Further, according to the invention, the coated yarns are woven into two-dimensional structures, single or multiple layers of which are then hot pressed to form a strengthened and heat-resistant two- or three-dimensional structure of fiber reinforced ceramic matrix composite.

DESCRIPTION OF THE PREFERRED EMBODIMENTS

Figure 1:
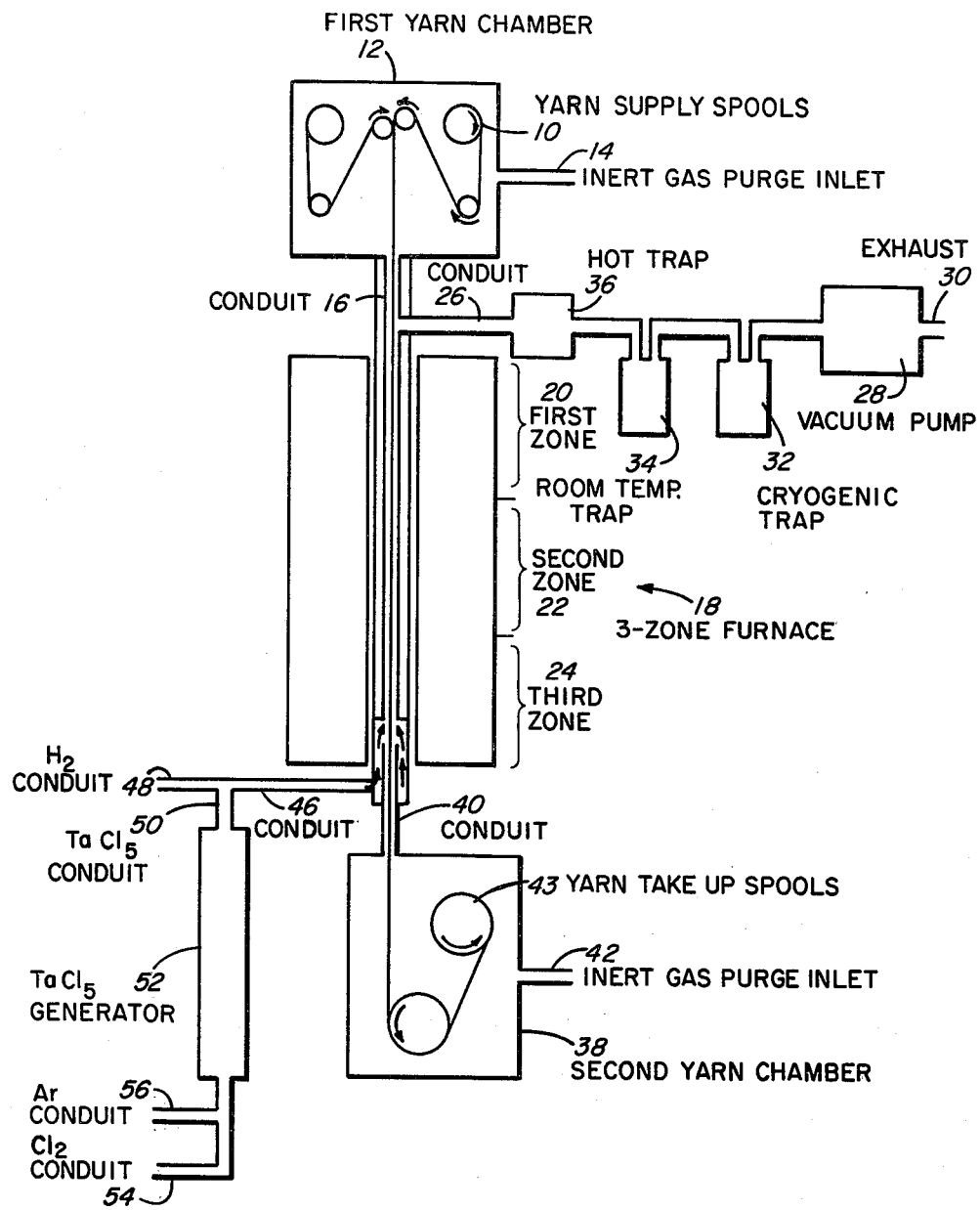
FIG. 1 is a diagrammatic illustration of an embodiment of apparatus which is suitable for use in the inventive continuous method and which was used to coat long lengths of graphite yarn with tantalum metal, the details of the coating being given in Example I.
Figure 2:
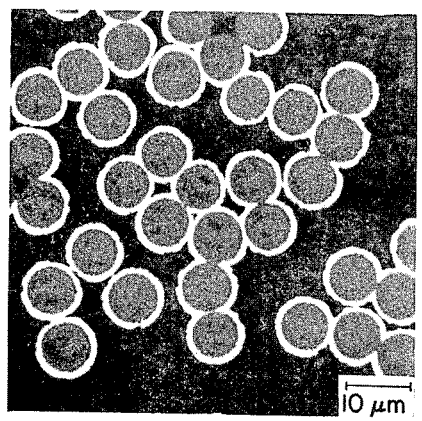
FIG. 2 is an optical photomicrograph of a cross section of Ta-clad carbon yarn prepared according to one embodiment of the invention, prior to being hot pressed.

The method according to the invention of forming one-directional reinforced metal-coated fibers can be very advantageously used to produce very long yarn strands having a controlled amount of deposition and which are suitable for forming a variety of other structures, including billets and woven material. Thus, the deposition on these other structures is likewise carefully controllable. By employing a continuous process as described below instead of a batch process, a coated yarn is obtained which has been in contact only minimally with corrosive gases and hence is superior to coated products obtained from a batch process in which corrosion has occurred. Furthermore, if desired, a slightly higher reaction temperature can be used in this continuous process than could be used in a batch process in which the temperature must be kept low in order to avoid such corrosion. And because the continuous process of coating the yarn as described below can be run more rapidly and economically than a batch process, industrial production is definitely possible here. Yet another advantage of this process is that very pure deposits of tantalum can be obtained at lower temperatures than those generally used in the prior art, such lower temperatures being less damaging to the fibers being coated than are higher temperatures. Additionally, the high strength and high density of the structures formed in several embodiments of the present invention are due in part to the uniformity of the deposits of refractory metal which are obtained on the individual filaments of yarn in this invention. The deposit on a single filament at any cross section of that filament is substantially the same as the deposit on that filament at any other cross section and is also substantially the same as the deposit on any other filament at any cross section.

The ceramic matrix composites formed according to one embodiment of the invention and which are suitable for being subjected to high temperatures have high strengths in part because voids or gaps which form when the coated yarn is subjected to elevated temperatures are eliminated by the simultaneous application of pressure. Furthermore, high strength in the composites was retained in part because some graphite was left as a core inside the outer layer of carbide, the carbide having formed from the metal and the yarn fiber material during the step of hot pressing.

In the practice of the embodiment of the invention wherein very long one-directional fibers are coated with a refractory metal, the fibers can be made of any ceramic, carbon, graphite, or metal fiber which is capable of being formed into very long lengths and which does not melt within or below the temperature range used for the plating reaction. Particularly preferred are carbon and graphite fibers because of their high tensile strengths, excellent heat resistant properties, and availability in very long lengths.

Although the following is described particularly in terms of using the chemical vapor deposition (CVD) reaction of tantalum pentachloride ($TaCl_5$) with hydrogen gas ($H_2$) to form and plate tantalum metal, it is expected that any volatile metal halide which reacts with $H_2$ can be used in the practice of the invention. A volatile halide of the refractory metals tantalum (Ta), niobium (Nb), molybdenum (Mo), tungsten (W), and rhenium (Re) can be used to great advantage to react with hydrogen to plate the corresponding refractory metal onto the chosen one-directional fibers. The plating conditions needed to provide coated yarn filaments which are uniformly coated throughout the bundle and which are uniformly coated throughout the length of the yarn are given below for a variety of metal halides in Table I.

TABLE I

Conditions for Uniform Deposition of Metal Onto Fibers

| Material Deposited | Preferred Volatile Metal Halide | Deposition Temperature Range (°C.) | Pressure (torr) | Pull Rate (m/hr) | Range of $H_2:MX_n$ ratio |
|---|---|---|---|---|---|
| Ta | $TaCl_5$ | 750–1100 | 1-300 | 2-100 | 2.5-20 |
| Nb | $NbCl_5$ | 750–1100 | 1-300 | 2-100 | 2.5-20 |
| Mo | $MoF_6$ | 350–900 | 1-300 | — | 3-20 |
| W | $WF_6$ | 350–900 | 1-300 | — | 3-20 |
| Re | $ReF_6$ | 350–900 | 1-300 | — | 3-20 |

Referring to the drawing, in FIG. 1 in one embodiment, yarn supply spools 10 are located within first yarn chamber 12, which has an inert gas purge inlet 14 and an outlet formed by conduit 16. Located below first yarn chamber 12 and connected thereto by conduit 16 is located three-zone furnace 18, with first zone 20 located above second zone 22, which is located above third zone 24. Conduit 16 combines with exhaust conduit 26 leading to vacuum pump 28, which is located immediately upstream from exhaust 30. Immediately upstream from vacuum pump 28 is located cryogenic trap 32. Next, upstream from cryogenic trap 32 is located room temperature trap 34, within which is located metal wire. Next upstream is located hot trap 36.

Three zone furnace 18 is located above second yarn chamber 38 and is connected thereto by conduit 40. Second yarn chamber 38 has an inert gas purge inlet 42, an outlet formed by conduit 40, and one or more yarn takeup spools 43.

Third zone 24 is intersected by conduit 46. Hydrogen conduit 48 and $TaCl_5$ conduit 50 merge to form conduit 46. Chlorine gas and argon gas in conduits 54 and 56, respectively, merge and pass into $TaCl_5$ generator 52. Within conduits 54 and 56 are located meters (not shown), which meter the flow of these two gases.

In the operation of the apparatus shown in FIG. 1, yarn supply spools 10 feed yarn to be coated down through conduit 16 into three-zone furnace 18, wherein coating takes place in a continuous process, the coated yarn being continuously drawn down into second yarn chamber 38 through conduit 40. Tantalum pentachloride is continuously produced in generator 52 as chlorine mixed with argon is passed over tantalum chips at a temperature of about 425° C. Tantalum pentachloride gas mixed with hydrogen gas in conduit 46 intersects three-zone furnace 18 along a line which is substantially parallel to the yarn itself, but in a direction opposite to the direction of motion of the yarn in three-zone furnace 18. Third zone 24 is maintained at a temperature which is about 150° below the temperature employed in the second zone 22 and in the first zone 20, both of which latter zones are maintained at a chosen temperature. At the chosen temperature the metal halide gas reacts with hydrogen gas to form the corresponding metal, which is plated onto the moving yarn.

Exhaust gases, which may include any unreacted hydrogen gas, unreacted $TaCl_5$ gas, products HCl gas, $TaCl_4$ gas, $TaCl_3$ gas, inert gas from first yarn chamber 12, and inert gas from second yarn chamber 38, are all continuously exhausted from the system via exhaust conduit 26. Hot trap 36 serves to collect any unwanted fibers which have been loosened from the yarn being coated. Room temperature trap 44, within which metal wire, preferably Ni, is located, serves to collect any $TaCl_4$ or $TaCl_3$ which may have formed in and been exhausted from three-zone furnace 18. Cryogenic trap 32 is used to prevent any water vapor from diffusing back into the coating chamber which might occur when vacuum pump 28 is a water vacuum pump.

A first inert gas is continuously passed through first yarn chamber 12 and then out via conduit 16 and via exhaust conduit 26, thereby preventing any excess hydrogen gas or other gas from contacting the yarn located within first yarn chamber 12. Likewise, a second inert gas is continuously passed into second yarn chamber 38 and is continuously removed therefrom through conduit 40 by means of vacuum pump 28, thereby preventing hydrogen gas and gaseous reaction products from contacting and attacking the coated yarn which is received in second yarn chamber 38 through outlet 44 and rolled onto take-up spools 43.

After $TaCl_5$ has formed within $TaCl_5$ generator 52, the $TaCl_5$ passes therefrom and mixes with hydrogen gas which has been preheated to about 400° C. The mixture then moves into three-zone furnace 18, where the following two reduction reactions are believed to take place:

$$TaCl_5 + \tfrac{1}{2}H_2 \rightarrow TaCl_4 + HCl \qquad \text{Equation 1}$$

$$TaCl_4 + 2H_2 \rightarrow Ta + 4HCl \qquad \text{Equation 2}$$

In the practice of the invention, the reactant gases must react together in the presence of the yarn which is to be coated. The coating chamber used in the practice of the invention must contain at least one zone held at a temperature sufficiently high for the reactant gases to react. Any means for obtaining a substantially uniform temperature distribution throughout the furnace can be used. For example, a three-zone furnace with a thermocouple located at each interface between two zones can be used.

A multiplicity of variables have been found to influence the rate and quantity of the coating of the yarn. These variables include the temperature in the coating reactor, the pressure in the coating reactor, the yarn pull rate, the relative flow rates of the reactants $H_2$ and $Cl_2$ (or of $H_2$ and the metal halide), the dilution (or concentration) of the acid halide reaction product, the number of yarns simultaneously being coated, and several factors involving the chamber geometry which include under particular circumstances the diameter of the coating chamber, the direction of the impinging of the reaction gases onto the yarns being coated, and the use of a means to separate the uncoated yarn and the coated yarn product from the reactant gases. Although these variables have to a large extent an interrelated effect on the coating which is obtained, some of these variables have at least one definite limit.

The temperature in the three-zone furnace 18 must be within a particular range when a metal is being coated onto yarn. The temperature must be sufficiently high for the metal-forming reactions to proceed. Also, if hydrides of the metal form relatively easily, as is the case with tantalum and niobium, the temperature should be higher than the temperature at which hydriding occurs (which, for tantalum and niobium is above about 750° C.), since formation of hydrides on the coated yarn produces a brittle product. Also the temperature must be lower than the temperature at which canning occurs (which for tantalum and niobium is about 1100° C. in this continuous process).

When a metal is being coated onto fibers, the total pressure in the coating chamber must be less than about 300 torr, since above this pressure canning will occur. Although a pressure of about 100 torr gave satisfactory coatings of tantalum metal, the rate of deposition was slower than at lower pressures; and a slowdown of the deposition rate has been found to signal the onset of canning. Therefore, for plating of tantalum, a pressure below about 100 torr is preferred. And even more preferred is a pressure of about 20 torr or lower. A lower limit on the pressure has not been found to exist, although it is suspected that below about 1 torr the reactants may exist in such small amounts that the coating reaction may not be able to be economically performed.

Any means for obtaining a suitable pressure as described above can be used in the practice of the invention. A Nash Hi Torr vacuum pump which is a high capacity rotary pump using water as the pumping fluid has been found to be acceptable for use in achieving the low pressures necessary in the reaction. When this type of vacuum pump is used, however, it is essential when tantalum is the metal being plated that water vapor not be allowed to back diffuse from the vacuum pump into the reaction chamber. To prevent such back diffusion, a liquid nitrogen trap can be used and will preferably be located immediately upstream from the vacuum pump. If such back diffusion is not prevented, the undesirable effect of the formation of tantalum oxide will occur. This material is undesirable because it gives rise to a brittle product.

The amount of tantalum plated onto the yarn has been found to vary inversely as the yarn velocity, provided that conditions are such that canning does not occur. A suitable pull rate is a pull rate within the range from about 2 to about 100 meters/hour.

The molar ratio of $H_2:Cl_2$ (or $H_2:TaCl_5$) was found to affect the deposition rate of tantalum metal in the following way. When the temperature of deposition was held constant at 950° C. and when the chamber diameter was held constant at 1.25 cm and when all of the data were normalized to a yarn velocity of 10.8 meters per hour, it was found that the rate of deposition increased as the ratio of $H_2:Cl_2$ increased, but only up to the ratio of 15:1. Above this ratio, further increases in the hydrogen flow rate (while the chlorine flow rate was held constant) did not achieve a further weight gain of metal. Hence, for each particular coating chamber diameter, yarn velocity, and temperature of deposition, it is expected that there is a definite ratio of $H_2:Cl_2$ above which further weight gains of plated metal do not occur. As stated above, it has been found that a slowdown of the deposition rate signals the onset of canning. And, although a definite ratio of $H_2:Cl_2$ was not found at which canning occurs, it is expected that some such ratio does exist.

The lower limit on the ratio of $H_2:Cl_2$ for the conditions specified above for the upper limit of 15:1 is about 0.5:1. Below this ratio, the coating reaction would proceed at a rate which would be uneconomically slow.

Also related to the deposition rate is the number of yarns which are passed through the coating chamber simultaneously. Given below in Table II is a summary of data showing the relative reduction in tantalum loading for multiple yarn coatings as compared with a single yarn coating, as well as the fraction of tantalum contained in the coating gas that was deposited onto the yarn(s).

TABLE II

| Deposition Rate For Multiple Yarn Deposits | | |
| --- | --- | --- |
| Number of Yarns (n) | Deposition Factor Ta loading for n yarns / Ta loading for 1 yarn | Fraction of Ta Deposited |
| 1 | 1.00 | 0.065 |
| 2 | 0.89 | 0.115 |
| 4 | 0.65 | 0.169 |

As the number of yarns was increased, the fraction of tantalum deposited increased. Thus, by using multiple yarns, one can use for coating a greater fraction of the available tantalum. Thus, for large scale production, the coating of four or more yarns simultaneously is to be desired.

Several aspects of the geometry in the coating chamber have been found to influence the quality and/or deposition rate of the coating obtained. It has been found that increased chamber diameter for constant gas flow results in a lower deposition rate. It has also been found that if the coating chamber has defects on which yarn can become snagged, the defects should be carefully machined down. If this is not done, the diameter of the coating chamber must be larger than would otherwise be necessary when yarns to be coated have the undesirable attribute of possessing a substantial fraction of broken fibers. It has been found that as the yarn passes through the coating chamber, the gas flow bends such outer broken fibers toward the wall of the coating chamber where they attach at any defects in the chamber and pull loose from the yarn. Although the number of such attached fibers is small at first, this number increases rapidly with time, forming a ball of matted coated fibers. This ball of fibers not only damages the yarn which passes near it, but also severely disturbs the gas flow pattern in the deposition chamber, thereby altering the deposition rate. As the chamber diameter decreases, these balls form increasingly rapidly. However, this problem can be virtually eliminated by carefully machining the walls of the coating chamber.

Related to the importance of the diameter of the coating chamber is the formation of deposits of coating metal on the sides of the coating chamber. In order to prevent excessive deposits, the inside of the coating chamber should be periodically treated to remove such deposits. This can be done by any suitable operation. For example, when tantalum has been deposited, the sides of the coater can be leached with a hydrofluoric-nitric acid mixture.

Another factor involving the geometry of the chamber which influences the quality of metal deposition is the direction at which the reactant gases impinge upon the yarn which is to be coated in the coating chamber. It has been found that when this angle is about 90°, undesirable effects occur. Using that angle, the yarn vibrates in the gas flow and becomes physically damaged when the diameter of the coating chamber is sufficiently small to provide economically realistic coating rates. On the other hand, when this angle of incidence is about 180° (i.e., the gas flow is parallel to the yarn and directed opposite to the motion of the yarn), the best quality coatings were obtained. Hence, to obtain the best coatings, an angle of about 180° should be used. However, relatively good results can be obtained with angles somewhat smaller than 180°.

A third factor related to the geometry of the chamber which influences the quality of the metal coating is the use of a means for separating the coated product from the reactant gases and from the reaction product gases. In the practice of the invention, any means for performing this separation can be used. However, the inert gas purge described above in the description of the drawings has been satisfactorily used and thus is known to give good results.

The type of inert gas to be used for the purge in the lower yarn chamber should be the relatively dense gas argon since its use will better protect the coated yarn from hydrogen and HCl than would lighter gases such as helium or neon. In the upper yarn chamber, either helium or argon can be used for the gas purge.

A definite upper limit on the thickness of plated metal which results in a weavable coated yarn has not yet been found to exist. However, it is anticipated that some such limit exists, above which the coated metal yarn would not be able to be woven. Furthermore, since it is desirable to retain an inner core of carbon or graphite in a composite for improved strength, the layer of deposited metal should be sufficiently thin so that when all of the metal coating is converted to metal carbide, such an inner core remains. Thus, the upper limit on thickness of the metal coating will depend upon the fiber diameter and the carbon or graphite density of the yarn being coated. For tantalum, in order to obtain a strong, heat-resistant yarn the ratio of the thickness of coating to the fiber diameter of the carbon or graphite yarn should be less than about 1:10.

Given above in Table I is a summary of suitable ranges for various factors which influence the quality of metal deposited onto yarns for a variety of metal halides which can be used to react with $H_2$ to deposit a metal in a CVD reaction. The conditions suitable for $NbCl_5$ are very similar to those for $TaCl_5$ due to the very similar chemistry of tantalum and niobium.

For the metals tantalum and niobium, use of the metal chloride in the plating is preferred over the use of the metal fluoride. Even though a lower temperature could be used with the fluoride than with the chloride, at such a lower temperature the undesirable formation of the hydride would occur. In addition, the boiling point of the fluoride is not sufficiently lower than the boiling point of the chloride to justify dealing with the problems that accompany use of the fluoride, including such problems as the possibility of leaks.

$TaCl_5$ and $NbCl_5$ are preferably formed by the in situ chlorination of the metal, as described above in the description of FIG. 1.

On the other hand, for the metals tungsten, molybdenum, and rhenium, the fluorides rather than other halides are preferred because the metal deposition can be achieved at temperatures which are 200°–500° C. lower than the temperatures used with the chlorides, bromides, or iodides. Furthermore, when the fluorides are used, because of their relatively high vapor pressures at room temperature, they can be used as a gas source without additional heating. If desired, the fluoride compounds can easily be formed by in situ fluorination of the respective metal, but this procedure requires special equipment due to the toxic nature of fluorine.

The chlorides, bromides, and iodides of tungsten, molybdenum, and rhenium have relatively high boiling points and hence are best formed by in situ chlorination of these metals.

For the metals tungsten, molybdenum, and rhenium, the lower end of the temperature range suitable for deposition of these metals given in Table I is not limited by the problem of hydride formation, which has been a very severe problem for tantalum, as described above. This is because tungsten, molybdenum, and rhenium are relatively inert to hydrogen. Furthermore, the lower end of the temperature range is also not limited by co-deposition of the metal with lower halides as with tantalum. Rather, the lower limit on the temperature of deposition is determined by nucleation kinetics, which are dependent upon the type of carbon yarn which is being coated. Thus, a carbon yarn will have to be coated at a temperature of about 50°–150° C. higher than a graphite yarn. For the metals tungsten, molybdenum, and rhenium, the upper limit on the temperature given in Table I (above) is the temperature above which canning of the yarn results.

It has been found that when yarn made particularly of graphite (Hercules HM-3000) was coated with tantalum metal, the resulting as-deposited (i.e., the coated yarn before it was hot pressed or woven) yarn had substantially increased strength as compared with the uncoated yarn, when the weight of metal coating was greater than about a 100% weight gain. However, when such tantalum coated graphite yarns having tantalum loadings greater than 100 weight percent gain were subjected to heating at about 2000° C. for a period of about 60 minutes without simultaneously applying pressure to the coated yarn, severe degradation of the strength and disintegration of the coated yarn itself were observed. Hence, when the percent weight gain of tantalum onto graphite yarn is greater than 100, it is believed to be imperative that if the metal-coated yarn is to be subjected to high temperatures, the yarn will be simultaneously subjected to pressure and heat for a sufficient time to convert essentially all of the tantalum to tantalum carbide. For Ta weight gains of less than 100 weight percent, hot pressing is also advised. This degradation described above is believed to be due to the phenomenon called the Kirkendall effect, wherein gaps or voids are produced at the TaC-C interface when the tantalum coated graphite is heated to a temperature at which the tantalum is converted to tantalum carbide. Closing of these gaps by simultaneous heating and application of pressure to yarns coated as described above provides a reinforced ceramic matrix composite with good strength and heat-resistant properties by converting the metal to the carbide of that metal yet retaining an inner core of graphite.

For converting tantalum deposited on carbon or graphite to tantalum carbide, the following hot-pressing conditions should be used. The temperature should be within the range from about 1900° C. to about 2400° C., 1900° C. being the ductile-brittle transition of TaC and 2400° C. being the temperature at which rapid reorganization of graphite or carbon fibers occurs. The pressure should be within the range from about 20 to about 40 Mpa (megapascals), and the time of application of the heat and pressure is dependent upon the thickness of the metal coating. It is important that during the hot pressing step essentially all of the tantalum be converted to carbide. If this is not done, later heating to high temperatures at which carbide forms without the simultaneous application of pressure would result in the formation of gaps.

The time in seconds required to react a sheet of tantalum metal which is X centimeters thick with carbon to form tantalum carbide is obtained from the following equation:

$$t = \frac{X^2}{K_{TaC}}, \text{ where}$$

$$K_{TaC} = 1.27 \cdot 10^{-2} \exp\left(-\frac{71{,}200}{R \cdot T}\right) \frac{cm^2}{sec},$$

R being the ideal gas constant and T being the temperature in degrees absolute. It has been found that for tantalum coatings of 3 micrometers or less, a time of hot pressing which is about two minutes will be sufficient to convert all of the tantalum to tantalum carbide.

Billets having good strength properties in the strong direction (i.e., the direction along the axis of the billet) can also be formed from the tantalum coated graphite or carbon yarn in the as-deposited condition by placing a multiplicity of metal coated yarns into a die and then simultaneously applying heat and pressure to convert the metal to the metal carbide. The hot pressing conditions should be those described above. When billets are to be formed, it is important if not essential for forming a strong product that the yarns be aligned properly in the die before they are hot pressed.

Tantalum coated graphite yarn in the as-deposited condition can be satisfactorily woven and the woven material can later be heat treated by the simultaneous application of heat and pressure in order to form the metal carbide and to eliminate voids, thus producing a very strong, heat resistant and erosion resistant two- or three-dimensional structure. The hot pressing conditions of temperature and pressure should be those described above.

When rhenium is the metal to be deposited, no such need for hot pressing exists. Rhenium does not form a stable carbide, but it does form a solid solution with carbon (11.7 weight % rhenium at 2486° C.). As a consequence, there would be minimal void formation at the rhenium-carbon interfaces; and therefore, one should not need to hot press to maintain optimum mechanical properties, as is required with tantalum. Rhenium coated yarn heated to at least 2000° C. for one hour is not expected to show the degradation in tensile strength that tantalum-coated yarn showed.

Niobium-tungsten, and molybdenum yarn are expected to exhibit void formation similar to that in tantalum. Thus, when these metals are deposited onto yarn, the coated yarn should be hot pressed to convert the metal to the metal carbide.

The carbon fiber reinforced carbides, the preparation of which is described above, can be used as structural components up to temperatures approaching the eutectic or peritectic temperatures of the highest carbon content carbide and carbon, i.e.,

| System | Eutectic or Peritectic Temperature |
|---|---|
| Ta + C ⇌ Liquid | 3445° C. |
| Nb + C ⇌ Liquid | 3305° C. |
| WC ⇌ Liquid + C | 2776° C. |
| MoC$_{0.82}$ + C ⇌ Liquid | 2584° C. |
| Re(11.7 wt % C) + C ⇌ Liquid | 2486° C. |

It should be noted that tantalum appears to be the most useful refractory metal for high temperature applications because it has the highest eutectic temperature.

Various tests can be used to characterize the quality of the coating which is obtained on the fibers. One of these tests is called a bend test, and this type of test is carried out by wrapping sections of coated yarn 180° around a series of mandrels having 2-mm decrements in the diameter, until noticeable damage to the yarn occurs. However, this test is to some extent subjective, since the unclad yarn as delivered from the manufacturer already contains a significant number of broken fibers.

Additional methods of examination which were used include scanning electron microscopy and metallography.

EXAMPLES

The following examples were carried out on one particular type of yarn, called HM-3000 yarn, which is made of graphite and contains 3000 filaments per strand with each filament having a diameter of about 7 μm, the yarn being obtainable from the Hercules Co.

EXAMPLE I

The coating in each instance took place in an apparatus essentially as described above and shown in FIG. 1, except that no cryogenic trap was used in runs 3-6. The metal halide used was TaCl$_5$. The reactant gases were in contact with the yarn over a distance of about 40 cm.

Given below in Table A are summaries of the influential coating variables used in a series of coating runs according to the invention, as well as the results of tests which were done on the resulting coated yarns in the as-deposited condition (i.e., before any further processing was done on the yarns, such as weaving or hot pressing).

From the results in Table A, it can clearly be seen that the tensile strength of Ta coated yarn in the as-deposited condition increases with Ta content provided that the angle of incidence of the reactants onto the yarn is held constant. Furthermore, a uniform coating of a layer of Ta was obtained on filaments making up a yarn bundle so that there was no noticeable variation between the center and the outside of the bundle; and no canning had occurred. Also, bend radii less than 2 mm were achieved for samples containing less than 50 weight percent Ta.

EXAMPLE II

Five compositions of tantalum clad yarn in the as-deposited condition were hot pressed into billets of various sizes at various temperatures and pressures, these variables and other significant variables being given in Table B, together with the results of bend tests performed in the resulting billets.

TABLE A[1]

| | Run 1 | Run 2 | Run 3 | Run 4 | Run 5 | Run 6 |
|---|---|---|---|---|---|---|
| Coating Variables | | | | | | |
| Coating Temperature (°C.) | 950 | 1000 | 950 | 950 | 950 | 950 |
| Coating Pressure (Torr) | 25 | 25 | 30 | 30 | 30 | 100 |
| Chlorine Flow Rate (cm$^3$/min) | 363 | 413 | 181 | 363 | 91 | 91 |
| Ratio of $H_2$:$Cl_2$ | 20:1 | 20:1 | 14:1 | 20:1 | 14:1 | 14:1 |
| Diameter of Chamber (cm) | 2 | 2 | 1.27 | 1.27 | 1.27 | 1.27 |
| No. of Strands Coated At Once | 1 | 2 | 1 | 1 | 1 | 1 |
| Pull Rate of Yarn (m/h) | 32 | 40 | 11.5 | 11.5 | 11.5 | 2.3 |
| Angle of Incidence of the Reactants Onto the Yarn (degs) | 150 | 150 | 90 | 90 | 90 | 90 |
| Weight Fraction of Ta in Coated Yarn | .39 | .40 | .52 | .70 | .77 | .70 |
| Thickness of Ta Deposited onto Yarn ($\mu$m) | 0.12 | 0.12 | 0.20 | 0.45 | 0.60 | 0.45 |
| Test Results | | | | | | |
| Bend Test Results (Failed at Bend Radius of __mm) | 1-2 | 2-3 | 13-15 | 20-22 | >25 | 13-15 |
| Tensile Strength[1,2] (Failed at __gm Load) | 12000 | 9900 | 5900 | 7600 | 8200 | 7100 |
| Description of Photomicrographs | All had uniform coat thickness on filaments within yarn bundle, and no canning had occurred. | | | | | |

[1]Uncoated HM-3000 has a tensile strength of 5500 g.
[2]Tested in an Instron tensile tester, on a 50.8 mm gauge length, with a crosshead speed of 0.127 mm/min., with a recorder chart speed of 25.4 mm/min. The yarn to be tested was bonded at each end to a 2 in. × 2 in. tab made from masking tape.

TABLE B

| Variables | Sample 1 | Sample 2 | Sample 3 |
|---|---|---|---|
| Composition (Volume % TaC) | 29% | 23% | 34% |
| Cross-sectional Area of Billet | 0.375 in$^2$ | .0625 in$^2$ | .0625 in$^2$ |
| Temperature of Hot Pressing | 2500° C. | 2600° C. | 2700° C. |
| Pressure of Hot Pressing (MPa) | 30 | 30 | 30 |
| Flexure Strength (MPa) (4 Point Bend Test*) | 210 | 150 | 105 |
| Time of Hot Pressing (i.e., Time of Application of Pressure) (minutes) | 35 | 25 | 15 |

*Measured in accordance with: Formulas for Stress and Strain, 5th ed., R. J. Roark and W. C. Young, Chapter 7, "Beams: Flexure of Straight Bars," Table 3, Case 1e.

Figure 3:
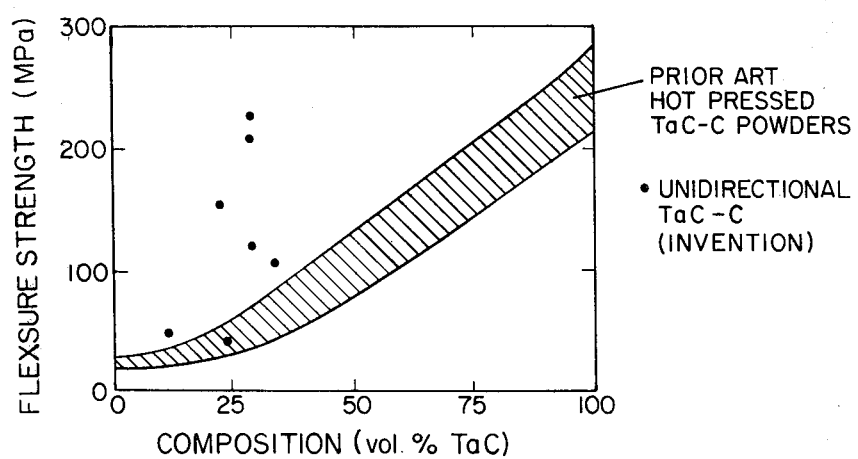
FIG. 3 is a graph of flexure strengths of billets prepared according to one embodiment of the invention, as well as the range usually encountered for the prior art hot pressed composites of TaC-C.

The results of the flexure strength test (4 Point Bend Test) from Table B are shown in FIG. 3, along with the range of flexure strengths which are usually encountered in the prior art for hot pressed powder composites of TaC-C. From FIG. 3, it can clearly be seen that unidirectional fiber-reinforced billets prepared by the method of this invention are capable of flexure strengths in the strong direction (i.e., along the axis) which are often at least 200% greater than the flexure strengths of hot pressed powder composites of the same composition. The large amount of scatter in the flexure data is believed to be caused by small variations in the alignment of the yarns during hot pressing, as well as from errors due to changes in alignment of the yarns during the test itself. Other work has shown that a misalignment of only 10° in the formation of the billets can result in a 50% reduction of flexure strength. Although it is preferred to minimize such misalignments in the hot pressings, no special precautions were taken to prevent movement of yarns after the die was loaded, and misalignments of 5° to 10° would not be unexpected. Therefore, if errors due to misalignment of the yarns during hot pressing and during testing can be eliminated, unidirectional fiber-reinforced hot pressed composites prepared according to the present invention possibly may be even more than 200% stronger than prior art powder composites of the same composition.

The foregoing description of a preferred embodiment of the invention has been presented for purposes of illustration and description and is not intended to be exhaustive or to limit the invention to the precise form disclosed. It was chosen and described in order to best explain the principles of the invention and their practical application to thereby enable others skilled in the art to best utilize the invention in various embodiments and with various modifications as are suited to the particular use contemplated. It is intended that the scope of the invention be defined by the claims appended thereto.

What is claimed is:

1. A method of coating long lengths of at least one multifilamentary yarn with a first metal selected from the group consisting of tantalum, niobium, tungsten, molybdenum, and rhenium, said multifilamentary yarn being made up of a bundle of individual filaments and being made of a material selected from the group consisting of graphite, carbon, ceramics, and metals, so as to produce yarn which is substantially uniformly coated on all filaments throughout each yarn bundle, said method comprising:
   (a) passing said at least one multifilamentary yarn continuously through a coating chamber into which a mixture of a gaseous halide of said first metal and $H_2$ gas is being continuously introduced and then passed along a line which is substantially parallel to said yarn, said coating chamber being heated to a chosen temperature which is sufficiently high to enable said halide of said first metal and said hydrogen to react to form said first metal, said chosen temperature being lower than about 1100° C. and said coating chamber being operated at a total pressure within the range from about 1 to about 300 torr,
   (b) allowing said gaseous halide of said first metal and said $H_2$ gas to react at said chosen temperature to form said first metal at the surfaces of said yarn filaments, thus producing at least first metal-coated fibers and an acid halide gas,
   (c) separating said first metal-coated fibers from said acid halide gas and from all reactants and other gaseous reaction products in said coating chamber by passing an inert gas purge over said first metal-coated fibers so as to minimize contact by back-diffusion of said first metal-coated fibers with said reactants, said acid halide gas and said other gaseous reaction products, and then
   (d) allowing said first metal-coated fibers to cool.

2. A method according to claim 1 wherein said chosen temperature is a temperature higher than the temperature at which hydriding of said first metal occurs.

3. A method according to claim 2 wherein said first metal is selected from the group consisting of niobium and tantalum, wherein said acid halide gas is HCl, wherein said yarn fibers are made of a material selected from the group consisting of graphite and carbon, and wherein said coating temperature is within the range from about 900° to about 1100° C.

4. A method according to claim 3 wherein said gaseous halide of said first metal and said $H_2$ gas are passed into said coating chamber in a direction which is substantially opposite to the direction of motion of said yarn fibers.

5. A method according to claim 4 wherein the total pressure in said reaction chamber is within the range from about 1 torr to about 100 torr, wherein a first inert gas is passed continuously over said fibers before they are coated so as to minimize degradation of said fibers before they are coated, and wherein said first metal-coated fibers are separated from said HCl, from said $H_2$, and from said gaseous halide of said first metal by passing a continuous flow of a second inert gas over said first metal-coated fibers so as to prevent hydride of said first metal from forming on said coated fibers and so as to minimize degradation of said first-metal coated fibers by said HCl.

6. A method according to claim 5 wherein said first metal is Ta, wherein said gaseous halide of said first metal is $TaCl_5$, wherein said $TaCl_5$ is produced by passing a flow of $Cl_2$ gas over Ta chips at a temperature of about 425° C. and wherein said $Cl_2$ and said $H_2$ are used in relative amounts such that said flow ratio of $H_2:Cl_2$ is within the range from about 15:1 to about 0.5:1.

7. A method according to claim 5 wherein Ta metal is deposited onto said yarn fibers in an amount less than about 370 weight percent Ta, thus producing Ta-coated fibers.

8. A method according to claim 5 wherein Ta is present on said Ta-coated yarn fibers in an amount less than the amount of Ta which would be required to convert essentially all of said yarn fibers to tantalum carbide upon heating.

9. A method of forming unidirectional billets comprising the method according to claim 8 and including also the step of hot pressing a multiplicity of Ta-coated unidirectional fibers at a temperature within the range from about 1900° to about 2400° C. and at a pressure within the range from about 20 to 40 Megapascals for a period of time sufficient to convert essentially all of said tantalum to tantalum carbide.

10. A method of producing a strengthened, heat-resistant, unidirectional fiber reinforced ceramic matrix composite, said method comprising the method according to claim 9 and including also the step of hot pressing said fiber at a temperature within the range from about 1900° to about 2400° C. and at a pressure within the range from about 20 to about 40 Megapascals for a period of time sufficient to convert essentially all of said Ta to tantalum carbide, thus producing a fiber-reinforced composite comprising an inner core of a material selected from the group consisting of carbon and graphite and a coating on said core of tantalum carbide.

11. A method according to claim 8 and including also the step of weaving said Ta-coated yarn fibers, thus forming a woven metal-coated fabric.

12. A method according to claim 11 and including also the step of hot pressing at least one layer of said woven metal-coated fabric.

* * * * *